(12) United States Patent
Tanaka

(10) Patent No.: US 7,608,997 B2
(45) Date of Patent: *Oct. 27, 2009

(54) ORGANIC EL DISPLAY DEVICE HAVING IMPROVED DESICCANT ARRANGEMENT

(75) Inventor: Masahiro Tanaka, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 45 days.

This patent is subject to a terminal disclaimer.

(21) Appl. No.: 10/968,088

(22) Filed: Oct. 20, 2004

(65) Prior Publication Data

US 2005/0110402 A1 May 26, 2005

(30) Foreign Application Priority Data

Oct. 20, 2003 (JP) .............................. 2003-358595

(51) Int. Cl.
H05B 33/00 (2006.01)
H05B 33/04 (2006.01)
H05B 33/06 (2006.01)

(52) U.S. Cl. ....................... 313/512; 313/506; 313/511; 313/498; 313/499

(58) Field of Classification Search .................. 313/511
See application file for complete search history.

(56) References Cited

U.S. PATENT DOCUMENTS

| 5,952,778 | A | * | 9/1999 | Haskal et al. ................ 313/504 |
| 6,656,609 | B2 | * | 12/2003 | Takahashi et al. ........... 428/690 |
| 6,737,176 | B1 | * | 5/2004 | Otsuki et al. ................. 428/690 |
| 6,861,802 | B2 | | 3/2005 | Hishida |
| 7,446,473 | B2 | * | 11/2008 | Tanaka ........................ 313/506 |
| 2001/0028218 | A1 | * | 10/2001 | Mashiko et al. ............. 313/553 |
| 2002/0057565 | A1 | * | 5/2002 | Seo .............................. 362/84 |
| 2002/0060654 | A1 | | 5/2002 | Park et al. |
| 2003/0038590 | A1 | * | 2/2003 | Silvernail et al. ........... 313/504 |
| 2003/0209980 | A1 | * | 11/2003 | Sasatani et al. ............. 313/553 |
| 2004/0046497 | A1 | * | 3/2004 | Schaepkens et al. ........ 313/506 |

FOREIGN PATENT DOCUMENTS

| JP | 2002260847 A | * | 9/2002 |
| JP | 2004-6286 | | 1/2004 |

* cited by examiner

Primary Examiner—Sikha Roy
(74) Attorney, Agent, or Firm—Antonelli, Terry, Stout & Kraus, LLP.

(57) ABSTRACT

In an organic EL display device having a pair of flexible substrates, and in which a plurality of layers are stacked between the pair of flexible substrates, wherein respective pairs of the plurality of layers adjacent to each other differ in electrical conductivity, and an electronic circuit including a pair of electrodes and a light emitting layer interposed between the pair of electrodes is formed in a stacked structure of the plurality of layers. A desiccant which is constituted of a plurality of island-like desiccants spaced from one another is incorporated into at least one of the pair of flexible substrates, and this obviates several problems which may result due to degradation of the desiccant.

4 Claims, 3 Drawing Sheets

ORGANIC EL DISPLAY DEVICE HAVING IMPROVED DESICCANT ARRANGEMENT

BACKGROUND OF THE INVENTION

The present invention relates to an organic EL device, and, more particularly, to an organic EL device having a multi-layered structure in which a desiccant is incorporated.

An organic EL display device comprises a substrate, a plurality of gate signal lines (scanning signal lines), extend in an x-direction and are juxtaposed in a y-direction transverse to the x-direction, on one of principal surfaces of the substrate, a plurality of drain signal lines (video signal lines), which extend in the y-direction and are juxtaposed in the x-direction, on the one of the principal surfaces of the substrate, and a plurality of pixel regions, each surrounded by a respective pair of the plurality of gate signal lines and a respective pair of the plurality of drain signal lines. Each of the pixel regions is provided with at least a thin film transistor, which is turned on in response to a scanning signal received from one of the gate signal lines, and a light emitting layer (an organic EL layer) to which an electric current is made to flow in response to a video signal supplied from one of the drain signal lines to the each pixel region through the thin film transistor.

Further, in view of a fact that the characteristics of the light emitting layer deteriorate due to oxidation or moisture, usually, another substrate, which differs from the above-mentioned substrates and which blocks the light emitting layer from the outside air, is provided, and a desiccant is arranged in the inside of a space which is blocked from the outside air.

Further, although these respective substrates are made of glass, for example, substrates which are formed of resin have been known recently. Further, there is also a known organic EL display device which has flexibility. In particular, there is a known organic EL display device having a multi-layered structure in which a desiccant is incorporated into a substrate having flexibility, and in which the substrate adopts the desiccant as one layer (see the following patent literatures 1-4).

[Patent Literature 1] Japanese Unexamined Patent Publication 2000-260847

[Patent Literature 2] Japanese Unexamined Patent Publication 2000-348849

[Patent Literature 3] Japanese Unexamined Patent Publication 2001-102167

[Patent Literature 4] Japanese Unexamined Patent Publication 2000-173766

SUMMARY OF THE INVENTION

However, it has been recently pointed out that an organic EL display device having such a constitution as described above has a drawback in that the desiccant is liable to be easily degraded compared to the other members.

When the inventors of the present invention have extensively investigated a cause of the above-mentioned drawback, it was found that, even when moisture invades, for example, a point of a portion of the display device where a desiccant is formed, the moisture tends to spread to a periphery of the desiccant. As a result, the moisture extends over the whole region of the desiccant, and, hence, the desiccant excessively contains moisture, whereby the function of the desiccant is lost.

Further, the inventors of the present invention also have found that the invasion of moisture into a desiccant also progresses from a periphery of the desiccant that is exposed from a substrate or through a pinhole which is unexpectedly formed in the substrate.

The present invention has been made under such circumstances and it is an object of the present invention to provide an organic EL display device which can obviate the degradation of a desiccant contained therein.

A summary of representative aspects of the invention disclosed in this specification, is as follows.

(1) An organic EL display device according to the present invention is, for example, characterized in that:

a first flexible substrate and a second flexible substrate are provided, and a stacked body formed of various kinds of layers which differ in conductivity is interposed between the first flexible substrate and the second flexible substrate, wherein the stacked body constitutes an electronic circuit including a pair of electrodes which are formed with a light emitting layer interposed therebetween;

a desiccant is incorporated into at least one of the first flexible substrate and the second flexible substrate; and the desiccant is constituted of a plurality of island-like desiccants, wherein each desiccant is separated from other neighboring desiccants.

(2) An organic EL display device according to the present invention is, for example, characterized in that:

a first flexible substrate and a second flexible substrate are formed, and a stacked body formed of various kinds of layers which differ in conductivity is interposed between the first flexible substrate and the second flexible substrate, wherein the stacked body constitutes an electronic circuit including a pair of electrodes which are formed with a light emitting layer interposed therebetween; and a gas barrier layer and a desiccant is incorporated into at least one of the first flexible substrate and the second flexible substrate, wherein the gas barrier layer is positioned on a side opposite to the stacked body with respect to the desiccant, and the desiccant is constituted of a plurality of island-like desiccants which are dispersed on a surface facing the gas barrier layer, each of the island-like desiccants being separated from others of the island-like desiccants adjacent thereto.

(3) An organic EL display device according to the present invention is, for example, on the premise of either the constitutions (1) or (2), characterized in that any material layers between which the desiccant is directly interposed do not include an ingredient of the desiccant.

(4) An organic EL display device according to the present invention is, for example, on the premise of the constitution (3), characterized in that one of the material layers between which the desiccant is interposed is an adhesive agent layer.

(5) An organic EL display device according to the present invention is, for example, on the premise of either one of the constitutions (1), (2), characterized in that the desiccant is incorporated in either one of the first flexible substrate and the second flexible substrate which is arranged at the light emitting layer side.

(6) An organic EL display device according to the present invention is, for example, on the premise of either one of the constitutions (1), (2), characterized in that the desiccant is incorporated in both of the first flexible substrate and the second flexible substrate.

(7) An organic EL display device according to the present invention is, for example, on the premise of either one of the constitutions (1), (2), characterized in that the plurality of island-like desiccants are arranged in a matrix array.

(8) An organic EL display device according to the present invention is, for example, on the premise of either one of the constitutions (1), (2), characterized in that the plurality of island-like desiccants are arranged in a honeycomb array.

(9) An organic EL display device according to the present invention is, for example, on the premise of any one of the constitutions (1), (2), (7), and (8), characterized in that a spaced-apart distance between one of the plurality of island-like desiccants and others thereof, which are arranged adjacent to the one thereof, is not less than 100 μm.

The present invention is not limited to the above-mentioned constitution, and various modifications are conceivable without departing from the technical concept of the present invention.

BRIEF DESCRIPTION OF THE DRAWINGS

FIGS. 4A and 4B are diagrams showing one embodiment of the constitution of a pixel provided in the organic EL display device according to the present invention, wherein FIG. 4A shows a plan view of the pixel, and FIG. 4B shows an equivalent circuit thereof.

DETAILED DESCRIPTION

Embodiments of an organic EL display device according to the present invention will be explained hereinafter in conjunction with the drawings.

Figure 4A:
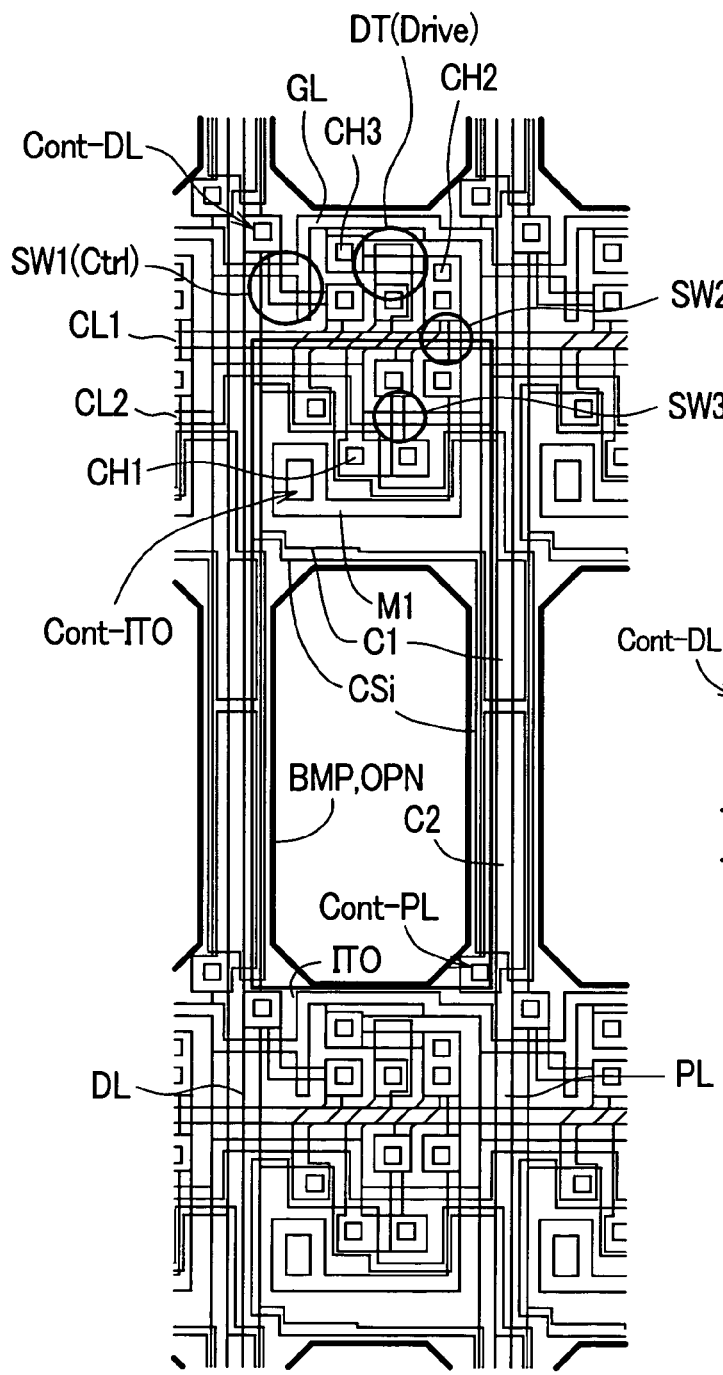
Figure 4B:
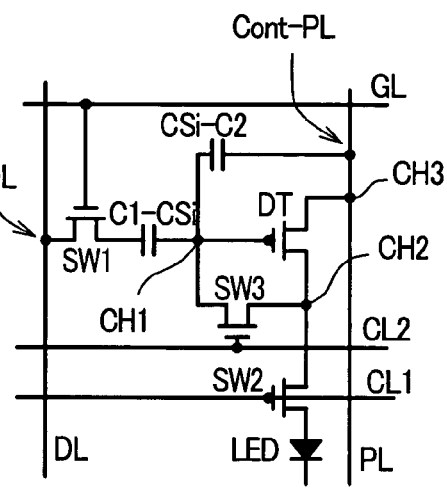

FIG. 4A and FIG. 4B are diagrams showing one embodiment of the constitution of a pixel of the organic EL display device according to the present invention.

FIG. 4A is a plan view showing one pixel of the organic EL display device and a portion in the vicinity of the pixel. The respective pixels of the organic EL display device are, for example, formed on a surface of a transparent substrate in a matrix array, and one of the pixels is shown in FIG. 4A. In each pixel, there is a minute circuit which is formed by stacking a conductive layer, a semiconductor layer, an insulation layer and the like, which are formed in given patterns.

That is, in the drawing, one pixel has an upper side thereof, as shown in FIG. 4A which is defined by a gate signal line GL which selectively drives the pixel, a left side thereof which is defined by a drain signal line DL which supplies a video signal to the pixel, a right side thereof which is defined by a current supply line PL which supplies an electric current to the pixel, and a lower side thereof defined by the gate signal line GL which selectively drives other neighboring pixels.

This one pixel is divided into an upper side and a lower side in FIG. 4A, wherein a light emitting layer formed of an organic EL layer is formed in the lower-side region and a circuit which forms an electric current corresponding to the video signal is formed in the upper-side region.

In the above-mentioned region where the light emitting layer is formed, for example, one electrode (anode: indicated by ITO in FIG. 4A) formed of a light transmitting conductive layer, the light emitting layer and another electrode (cathode) are sequentially stacked from the substrate side. The light emitting layer is formed in a state such that the light emitting layer is embedded in an opening portion of (BPM, OPN in FIG. 4A) a bank layer formed over the above-mentioned one electrode, and this portion substantially constitutes a light emitting portion. Further, another electrode is formed in common with respect to respective pixels in a state such that this other electrode also covers an upper surface of the bank layer.

Using one electrode as the anode and another electrode as the cathode, when an electric current is made to flow between these electrodes, the light emitting layer is configured to emit light with an intensity corresponding to the supplied electric current. Here, the bank layer is provided for obviating the transmission of light emitted from the pixel to the inside of the neighboring pixel or for forming a light emitting layer having fluidity originally in the manufacturing step to produce a given profile.

In the above-mentioned region formed in the above-mentioned circuit, there are switching elements SW1, SW2, SW3, a control signal line CL1 which turns the switching element SW2 on and off, a control signal line CL2 which turns the switching element SW3 on and off, a drive transistor DT, a capacitive element C1-CSi, and a capacitive element CS1-C2.

The circuit fetches the video signal from the drain signal line DL in response to the scanning signal from the gate signal line GL, wherein, depending on the magnitude (voltage) of the video signal, the electric current from the electric current supply line PL is supplied to one electrode in the region on which the light emitting layer is formed.

Here, the switching elements SW2, SW3 and the capacitive element CS1-C2 are provided to correct irregularities which occur when a threshold value voltage of the drive transistor DT varies for every pixel.

FIG. 4B shows an equivalent circuit in the above-mentioned one pixel and substantially corresponds to the geometrical arrangement shown in FIG. 4A.

The switching element SW1 is turned on in response to the scanning signal from the gate signal line GL and the video signal from the drain signal line DL is supplied to one electrode C1 of the capacitive element C1-CSi through the switching element SW1. Here, the other electrode of the capacitive element C1-CSi is held in a floating state. Here, the capacitive element C1-CSi has a function of holding the gate potential of the drive transistor DT, having a gate electrode which has the same potential as the other electrode, at a given value over a given period.

In such a state, first of all, the control signal transmitted through the control signal line CL1 turns on the switching element SW2. Here, although the drive transistor DT is not turned on, a node CH2 side of the drive transistor DT is connected to the reference potential through the organic EL element LED from the floating state, and, hence, the potential is elevated to a given value.

Next, the control signal which is transmitted through the control signal line CL2 turns on the switching element SW3. Accordingly, one electrode CSi of the capacitive element CS1-C2 in a floating state is connected with the node CH2 side of the drive transistor DT through the switching element SW3, and, hence, the potential thereof is elevated to the above-mentioned given value. Here, the gate potential (the potential of the node CH1) of the drive transistor DT is equal to the potential of the output side (the node CH2), and, hence, a channel layer of the drive transistor DT interrupts the flow of charge.

Since a given electric current flows in the current supply line PL regardless of the video signal transmitted through the drain signal line DL, the potential is substantially fixed. Accordingly, by sequentially turning on the two switching elements SW2, SW3 (allowing the respective channel layers to assume a conductive state), it is possible to enable the capacitive element CS1-C2 of every pixel to store substantially the same amount of charge.

In such a state, when the channel layer of the switching element SW3 is closed and, subsequently the switching element SW1 is turned on, corresponding to the voltage (video signal) applied to one electrode C1 of the capacitive element C1-CSi, a difference is generated between the potential of the node CH1 (the gate potential of the drive transistor DT) and the potential on the output side (node CH2 side). By turning on the drive transistor DT in response to the potential difference and by controlling an amount of charge which flows into the turned-on channel, it is possible to allow the organic EL element LED to emit light with the desired brightness.

Here, the pixel of the organic EL display device to which the present invention is applicable is not always limited to the above-mentioned constitution and, for example, the present invention is also applicable to a pixel constitution which has no circuit for correcting the irregularities of a threshold value voltage of the drive transistor DT for every pixel or a pixel constitution which has no bank layer.

Figure 1:
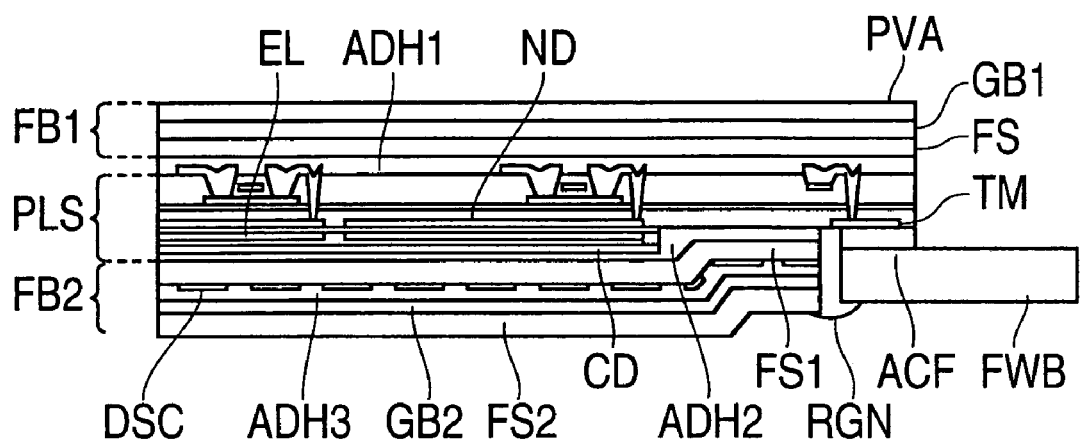
FIG. 1 is a cross-sectional view showing one embodiment of the organic EL display device according to the present invention.

FIG. 1 is a cross-sectional view of the organic EL display device on which the above-mentioned pixels are formed, and it is depicted to include a cross section of the light emitting layer.

The organic EL display device is, in general, constituted of a stacked body PLS in which the electronic circuit shown in FIG. 4B is formed by stacking a conductive layer, a semiconductor layer, an insulation layer and the like (various kinds of layers having different conductivities) which are patterned in a given way, a first flexible substrate FB1 which is adhered to one surface of the stacked body PLS using an adhesive agent layer ADH1, a second flexible substrate FB2 which is adhered to another surface of the stacked body PLS using an adhesive agent layer ADH2, and a flexible printed wiring board FWB which is connected with a terminal TM formed on the stacked body PLS.

<<Stacked Body PLS>>

The stacked body PLS is configured such that, for example, the stacked body is formed by stacking various kinds of layers, which differ in TKconductivity in the upper-side direction as seen in the drawing, while using the anode ND on which the light emitting layer EL (to be described) later is formed as a lowermost layer, and, thereafter, the above-mentioned light emitting layer EL is formed on a surface side of the stacked body on which the anode ND is formed, and the cathode CD is formed on the anode ND.

Here, when the stacked body PLS is formed by stacking the various kinds of layers which differ in conductivity, while using the anode ND as the lowermost layer, it is necessary to use a substrate which has a flat surface. However, this substrate is removed in a manufacturing step and is not shown in the drawing.

As described above, by stacking various kinds of layers which differ in conductivity, the gate signal lines GL, the drain signal lines DL, the control signal lines CL1, CL2, the current supply line PL, the switching elements SW1 to SW3, the drive transistor DT, the capacitive elements C1-CS1, CSi-C2 and the above-mentioned anode ND shown in FIG. 4B are formed.

In this case, the connection of the above-mentioned respective circuit members between the different layers is performed through contact holes formed in the insulation films, and, at the same time, at portions where it is necessary to supply signals from the outside, connection lines are pulled out to the surface on which the anode ND is formed through contact holes formed in the insulation films in the same manner, and they are connected with the terminal TM (a group of terminals) formed on a portion of the periphery of the surface. This is provided for ensuring the connection of the stacked body PLS with the flexible printed wiring board FWB to be described later.

Further, in forming the light emitting layer EL on the surface side on which the anode ND is formed and, thereafter, forming the cathode CD on the anode ND, it may be possible that the stacked body PLS which is formed so far is laminated to the first flexible substrate FB1 and then this flexible substrate FB1 is used as the substrate at the time of manufacturing. Alternatively, it also may be possible that another substrate having a relatively large rigidity is used.

Further, with respect to the light emitting layer EL, when necessary, a hole transport layer may be interposed on the anode ND side, and an electron transport layer or an electron injection layer may be interposed on a cathode CD side. In this specification, the light emitting layer is a concept which includes the respective layers.

<<First Flexible Substrate FB1>>

The first flexible substrate FB1 is constituted such that a gas barrier layer GB1 is formed on one surface of a film base body FS. The gas barrier layer GB1 is, for example, formed of an aluminum deposited film or a silica/alumina co-vapor-deposited film. The gas barrier layer GB1 is a layer which can prevent the intrusion of oxygen or the like from the outside. Further, a protective film PVA is formed on an upper surface of the gas barrier layer GB1 to protect the gas barrier layer GB1 from an external obstacle.

Further, with respect to the first flexible substrate FB1 having the above-mentioned constitution, the adhesive agent ADH1 is applied to a surface of the film base body FS, and the first flexible substrate FB1 is adhered to a surface of the stacked body PLS which is opposite to the surface on which the cathode CD is formed by way of the adhesive agent ADH1.

<<Second Flexible Substrate FB2>>

The second flexible substrate FB2, which is different from the first flexible substrate FB1, is formed of a substrate in which desiccant layers DSC, are interposed, wherein the intrusion of moisture from the outside is absorbed by the desiccant layers DSC thus preventing the moisture from reaching the above-mentioned light emitting layers EL.

Further, although the desiccant layers DSC are formed over the whole region of the second flexible printed wiring board FB2, the desiccant layers DSC are constituted of a plurality of dispersed desiccant layers DSC. Due to such a constitution, each desiccant layer DSC constitutes an island-like desiccant layer DSC which is physically separated from other neighboring desiccant layers DSC. The reason why such a constitution is adopted is as follows. That is, even when one desiccant layer DSC contains moisture, for example, the constitution can prevent the moisture from reaching other neighboring desiccant layers DSC. The reason why such a constitution is adopted will be further explained in detail hereinafter.

That is, as one member which constitutes the second flexible substrate FB2, a first film base body FS1 is provided. The first base body FS1 constitutes a film which is positioned on the stacked body PLS side in the second flexible substrate FB2.

Figure 2:
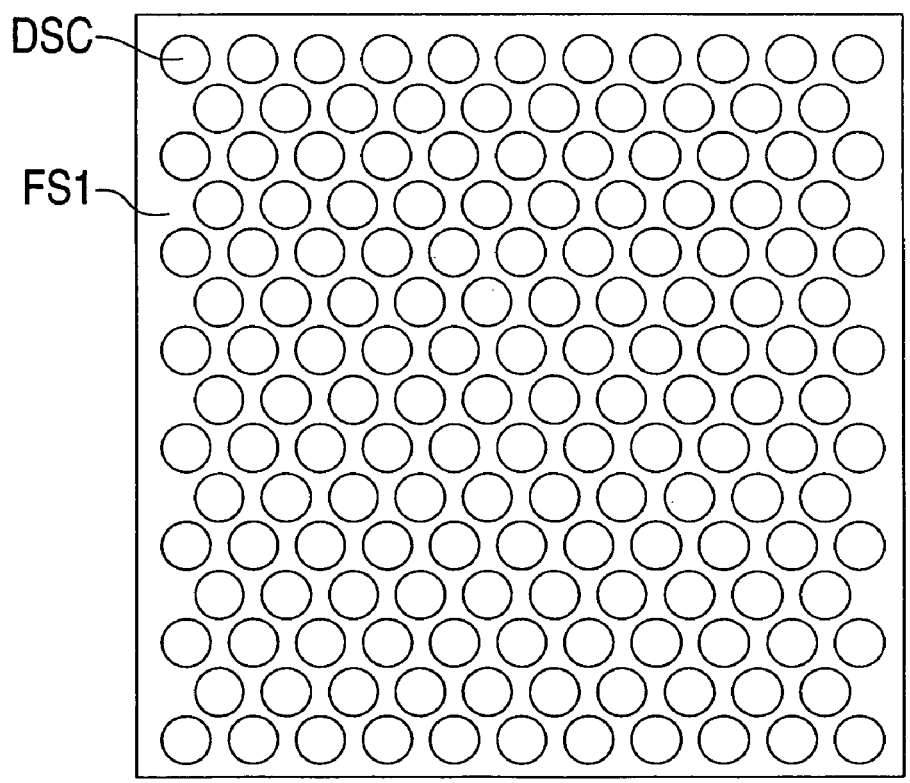
FIG. 2 is a plan view of one embodiment of desiccant layers used in the organic EL display device according to the present invention.

Then, the desiccant layers DSC are formed on an upper surface of the first film base body FS1. The desiccant layers DSC are formed in an island pattern and these desiccant layers DSC are arranged in a honeycomb shape, as shown in FIG. 2, which is a plan view. These respective desiccant layers DSC are arranged such that the distance between one desiccant layer DSC and another neighboring desiccant layer DSC becomes not smaller than 100 μm, for example. In this case, the formation of the respective desiccant layers on the film is preferably performed by a printing method, for example.

As a material of the desiccant layers DSC, for example, metal alcoholate, zeolite paste, anhydrous metal halide, or metal hydride or the like is used. The material is dispersed in an organic solvent or formed into a solvent such as ink. Then, the material is printed on the first film base body FS1 under a dry environment.

Here, since the metal alcoholate is soluble in the solvent, printing ink can be produced without a binder. Further, by drying the solvent after applying the printing ink to the film, it is possible to form the desiccant (film) on the film. To prevent the printing ink even in a solvent state from being exposed to the outside air, a dry box is used and the drying is held at a level which allows the evaporation of the solvent ($\leqq 120°$ C.) so as to prevent the absorbency loss attributed to the decomposition of the alcoholate. Water absorption is performed in an irreversible reaction and swelling is not more than 10 percent, and, hence, the distance between the island-like desiccant and the neighboring island-like desiccant (island distance) is not particularly limited.

The zeolite paste is obtained by applying a resin solvent in which zeolite is dispersed to the first base body FS1 and by baking the resin solvent. Zeolite is mixed into a resin binder as a filler and exhibits a reversible water absorption (however, the regeneration requires a temperature of not less than 150° C.). Due to the moisture absorption attributed to the surface absorption of zeolite, it is possible to remove a trace amount of moisture, although the water absorption amount is not large and has the characteristic that volumetric expansion is not induced.

In printing the desiccant layers DSC, for example, a screen printing method is preferably used. This is because desiccant layers DSC having a relatively large thickness can be selectively formed.

Further, there is another film base body (a second film base body FS2), and a gas barrier layer GB2 is formed on one side of the second film base body FS2. The gas barrier layer GB is, for example, formed of an aluminum vapor-deposited film or a silica/alumina co-vapor-deposited film. The gas barrier layer GB2 is a layer which can prevent the intrusion of oxygen or the like from the outside.

Then, by laminating a surface of the second film base body FS2 on the gas barrier layer GB2 side and a surface of the first film base body FS1 on the desiccant layers DSC side using an adhesive agent layer ADH3, it is possible to constitute the second flexible substrate FB2.

As a material of the adhesive agent layer ADH3 in such a case, for example, polypropylene or polyethylene is used. Further, it is necessary that the desiccant is not contained in the material. This is because, of the fact that, even the content of the desiccant contained in the adhesive agent layer ADH3 is small in amount, so that a transfer of the moisture is conducted between the desiccant layers DSC which are formed in a physically spaced-apart manner due to the interposition of the desiccant.

Here, in the second flexible substrate FB2 having such a constitution, the adhesive agent layer ADH2 is applied to a surface of first base body FS1 opposite to a surface on which the desiccant layers DSC are formed, and, thereafter, the second flexible substrate FB2 is adhered to the surface of the stacked body PLS on which the cathodes CD are formed. In this case, the second flexible substrate FB2 is adhered such that a portion where the terminal TM (a group of terminals) of the stacked body PLS is formed is exposed.

Here, the second flexible substrate FB2 is not always limited to the above-mentioned constitution. It is needless to say that, for example, the second flexible substrate FB2 is constituted such that a gas barrier layer is formed on a film base body, and the above-mentioned desiccant layers DSC having the above-mentioned constitution are formed on an upper surface of the gas barrier layer, and a surface on which the desiccant layers DSC are formed is adhered to the stacked body PLS by way of an adhesive agent layer.

<<Flexible Printed Wiring Board FWB>>

The flexible printed wiring board FWB is a printed wiring board for supplying signals to the organic EL display device, and one end thereof is electrically connected with the terminal TM (the group of terminals) which is formed on the surface of the stacked body PLS which is exposed from the second flexible substrate FB2.

The connection between the terminal TM and the flexible printed wiring board FWB is established by way of an anisotropic conductive film ACF. Further, in a gap defined between the flexible printed wiring board FWB and the second flexible substrate FB2, a resin film RGN is filled in so as to prevent the intrusion of the moisture or the like.

In the organic EL display device having such a constitution, with respect to the desiccant layers DSC which are interposed in the second flexible substrate FB2, if the desiccant layers DSC are formed in a film-like or linear contiguous pattern, the desiccant layers DSC are exposed at end portions of the second flexible substrate FB2, for example, and the moisture is absorbed through the desiccant layer DSC at such portions, and, hence, the desiccant layers DSC react in a short time, whereby dehumidification becomes no longer possible.

To the contrary, in case where the respective desiccant layers DSC are formed in an island-like isolated pattern, as in the case of this embodiment, even when one of these desiccant layers DSC is exposed and moisture absorption is performed, the moisture absorption does not reach the ambient separated desiccant layers DSC, and, hence, most of the desiccant layers DSC can maintain the function thereof. Further, when a pinhole or the like is formed in the gas barrier layer GB2, for example, and moisture absorption is performed through the pinhole, only the desiccant layers DSC which are arranged close to the pinhole lose the function thereof, and, hence, the rest of the desiccant layers DSC can maintain the function thereof.

Further, since the thickness of the individual desiccant layers DSC is not restricted within a certain range, it is possible to enhance the degree of hygroscopicity.

For example, when the material of the first film base body FS1 is polyethylene terephthalate, the vapor transmission quantity is approximately 4.2 g/m2·24 hr under a saturated vapor condition at a normal temperature of 25° C. provided that the thickness of the first base body FS1 is 100 μm. It is considered that the moisture passes through the first base body FS1 mainly when the thickness of the polyethylene terephthalate is 50 μm. Assuming that the size of one side of the pattern of the desiccant layer DSC is 0.5 mm and the distance between the desiccant layers DSC is 100 μm, the water transmission amount per 1 day or 24 hours is $5 \times 10^{-12}$ g. Assuming that the thickness of the desiccant is 20 μm, the weight per one pattern of one desiccant is $1 \times 10^{-7}$ g, and one desiccant can perform a water absorption of $1 \times 10^{-8}$ g, provided that the water absorption rate is 10 percent. Accordingly, a row of desiccants can perform dehumidification for approximately 2000 days. Further, even when a pinhole is formed in the gas barrier layer, for example, the influence of the formation of the pinhole spreads toward an outer periphery of the isolated pattern in accordance with the above-mentioned calculation, and, hence, it is possible to suppress the effects of the local defect.

Figure 3:
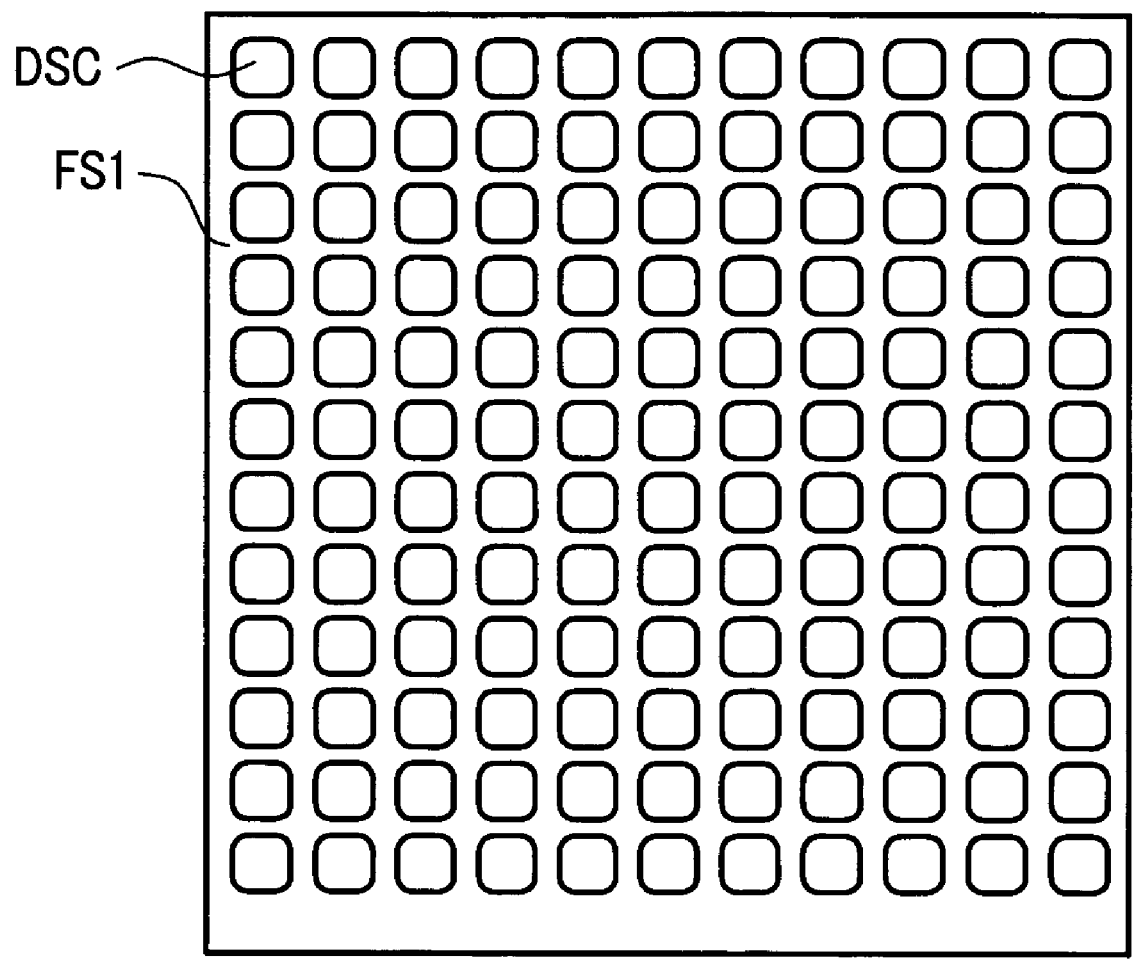
FIG. 3 is a plan view of another embodiment of desiccant layers used in the organic EL display device according to the present invention.

In the above-mentioned embodiment, although the desiccant layers DSC formed on the surface of the first film base body FS1 are arranged in a honeycomb shape, as shown in FIG. 2, it is needless to say that the desiccant layers DSC may be arranged in a matrix array, as shown in FIG. 3, for example.

Further, although the desiccant layers DSC are formed only on the second flexible substrate side in the above-mentioned embodiment, it is needless to say that the desiccant layers DSC also can be formed on the first flexible substrate side.

What is claimed is:

1. An organic EL display device comprising:
   a plurality of light emitting elements each comprising a stacked body comprising an anode, a cathode and a light emitting layer;
   a gas barrier layer covering the plurality of light emitting elements,
   a desiccant comprising a plurality of island-like desiccants, dispersed on a surface of a film base body, facing the gas barrier layer, wherein each of the island-like desiccants is separated from others of the island-like desiccants adjacent thereto,
   wherein the film base body is formed between the plurality of light emitting elements and the plurality of island-like desiccants;
   wherein a first adhesive agent layer is formed between the plurality of island-like desiccants and the gas barrier layer;
   wherein a second adhesive agent layer is formed between the plurality of light emitting elements and the film base body;
   wherein the film base body is adhered to the plurality of light emitting elements with the second adhesive agent layer, and
   wherein the film base body and the plurality of island-like desiccants are adhered to the gas barrier layer.

2. An organic EL display device according to claim 1, wherein the film base body and the plurality of island-like desiccants are adhered to the gas barrier layer with the first adhesive agent layer.

3. An organic EL display device according to claim 2, wherein the first adhesive agent layer is comprised of polypropylene.

4. An organic EL display device according to claim 2, wherein the first adhesive agent layer is comprised of polyethylene.

* * * * *